United States Patent
Kitani

(10) Patent No.: US 10,694,650 B2
(45) Date of Patent: Jun. 23, 2020

(54) TAPE FEEDER

(71) Applicant: Panasonic Intellectual Property Management Co., Ltd., Osaka (JP)

(72) Inventor: Minoru Kitani, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 17 days.

(21) Appl. No.: 16/207,230

(22) Filed: Dec. 3, 2018

(65) Prior Publication Data

US 2019/0200492 A1 Jun. 27, 2019

(30) Foreign Application Priority Data

Dec. 26, 2017 (JP) ................. 2017-249748

(51) Int. Cl.
*H05K 13/04* (2006.01)
*B65H 20/22* (2006.01)

(52) U.S. Cl.
CPC ......... *H05K 13/0419* (2018.08); *B65H 20/22* (2013.01); *B65H 2701/1942* (2013.01)

(58) Field of Classification Search
CPC ........ B65H 20/20; B65H 20/22; H05K 13/02; H05K 13/021; H05K 13/0215; H05K 13/0417; H05K 13/0419
See application file for complete search history.

(56) References Cited

FOREIGN PATENT DOCUMENTS

JP 2015-115412 A 6/2015

*Primary Examiner* — William E Dondero
(74) *Attorney, Agent, or Firm* — Pearne & Gordon LLP

(57) ABSTRACT

A tape feeder includes a tape guideway that has an insertion port, a first tape transporter that transports a leading tape to a component extraction position in the tape guideway, a second tape transporter that transports the following tape from the insertion port to the first tape transporter, a following tape holder that has a first supporter that supports one side of an uninserted portion of the following tape in a width direction from a lower side, and a second supporter that supports the other side of the uninserted portion in a width direction from the lower side, and holds the uninserted portion of the following tape, and a displacer that displaces the uninserted portion of the following tape from the following tape holder. A width of one end portion of the second supporter decreases toward the insertion port.

6 Claims, 15 Drawing Sheets

TAPE FEEDER

BACKGROUND

1. Technical Field

The present disclosure relates to a tape feeder that feeds a component stored in a carrier tape to a component mounting device.

2. Description of the Related Art

In the related art, a tape feeder that can continuously feed a following carrier tape (a following tape) to a component extraction position after a leading carrier tape (a leading tape) storing a component has been known (for example, Japanese Patent Unexamined Publication No. 2015-115412). The tape feeder disclosed in Japanese Patent Unexamined Publication No. 2015-115412 includes a tape holder that holds the following tape having a tip end inserted into a tape input port on an upstream side of the tape input port. The tape holder has a movable bracket displaced depending on operation by a worker in a vertical direction, and is configured such that the following tape held by displacing the movable bracket up and down can be dropped to the lower side.

In the tape feeder, when the leading tape is discharged, the following tape becomes the leading tape, and supply of the component is started, the worker operates the tape holder and drops the leading tape from the tape holder, to correct a position of the leading tape. Accordingly, it is possible to replenish the following tape. Thereafter, a new following tape is held by the tape holder, and a tip end of the following tape is inserted into the tape input port, so that an operation of replenishing the carrier tape is completed.

SUMMARY

A tape feeder according to the present disclosure is used in a component mounting device for installing a component on a board, the component being held by a mounting head, transports a carrier tape containing the component, and supplies the component to a component extraction position by the mounting head. The tape feeder includes a tape guideway that has an insertion port into which a leading tape and a following tape can be inserted, the following tape being a carrier tape fed after the leading tape, a first tape transporter that is provided on a downstream side of the tape guideway, and transports the leading tape to the component extraction position in the tape guideway, a second tape transporter that is provided on an upstream side of the tape guideway, and transports the following tape from the insertion port to the first tape transporter, a following tape holder that has a first supporter that supports one side of an uninserted portion of the following tape not inserted into the insertion port in a width direction from a lower side, and a second supporter that supports the other side of the uninserted portion in a width direction from the lower side, and holds the uninserted portion of the following tape at a position separated upward from an uninserted portion of the leading tape, and a displaces that displaces a position of the second supporter upward with respect to the first supporter, and displaces the uninserted portion of the following tape from the following tape holder. A width of one end portion of the second supporter decreases toward the insertion port.

According to the present disclosure, an operation of replenishing the following tape to the tape feeder can be optimized.

DETAILED DESCRIPTION

In a tape feeder disclosed in Japanese Patent Unexamined Publication No. 2015-115412, it is difficult to drop a carrier tape held by a tape holder only by operating a movable bracket once up and down. When the carrier tape is not dropped, a worker can move and drop a carrier tape by hands. However, when plurality of tape feeders are densely arranged in parallel to each other, it is necessary to input a finger of the worker into a very narrow space, and thus there is a problem in that workability is poor.

Here, an aspect of the present disclosure is to provide a tape feeder that can optimize an operation of replenishing a following tape to the tape feeder.

Figure 1:
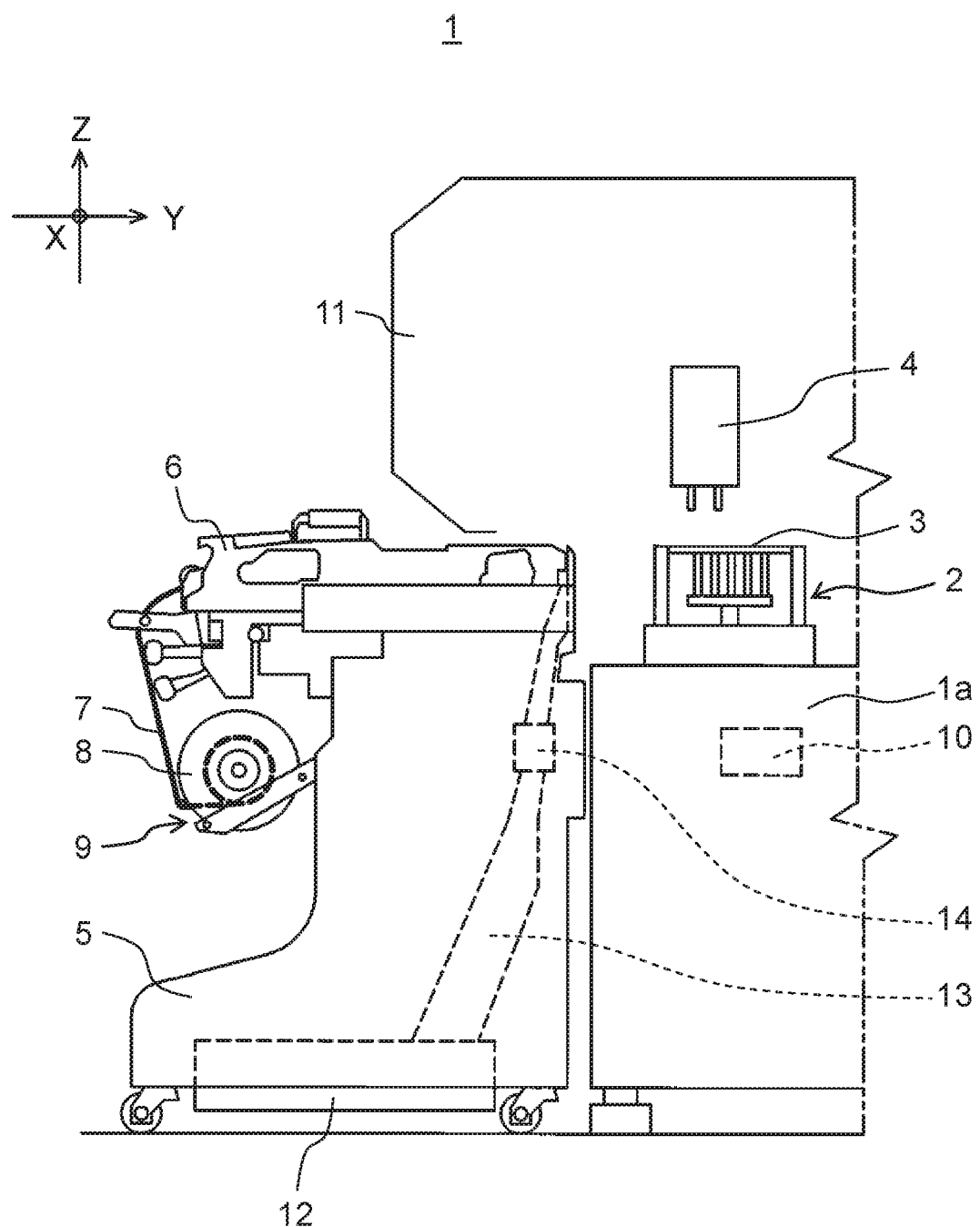
FIG. 1 is a diagram illustrating a configuration of a component mounting device according to an embodiment of the present disclosure.

Embodiments of the present disclosure will be described in detail with reference to the following drawings. Configurations, shapes, and the like described below are examples for explanation, and can be appropriately changed according to the specifications of a component mounting device, the tape feeder, and a carriage. Hereinafter, in all the drawings, corresponding components are designated by the same reference numerals, and duplicated description will be omitted. In FIG. 1, an X direction (a paper surface vertical direction in FIG. 1) in a board transport direction and a Y direction (a left-right direction in FIG. 1) perpendicular to the board transport direction are illustrated as two axial directions perpendicular to each other in a horizontal plane. Further, a Z direction (an up-down direction in FIG. 1) is illustrated as a height direction that is perpendicular to the horizontal plane.

Further, a configuration of component mounting device 1 will be described with reference to FIG. 1. Component mounting device 1 functions to manufacture a mounting board on which a component is mounted on a board thereof. Board transport mechanism 2 provided on an upper surface of base 1a transports board 3 in the X direction, determines the position of board 3, and holds board 3. Mounting head 4 that moves horizontally (in the X direction and the Y direction) by a not-illustrated head moving mechanism is installed above board transport mechanism 2. Plurality of tape feeders 6 are installed at an upper portion of carriage 5 coupled to base 1a on a lateral side of board transport mechanism 2, side by side in the X direction.

Reel holder 9 that rotatably supports reel 8 on which carrier tape 7 that stores the component supplied to component mounting device 1 is wound is installed on a lower side of tape feeders 6 on a front side of carriage 5. Tape feeders 6 transport carrier tape 7 stored in reel 8 in a tape feeding direction, to supply the component to a component extraction position by mounting head 4.

Component mounting device 1 includes board transport mechanism 2, mounting head 4, and mounting controller 10 that controls the head moving mechanism. Mounting controller 10 transmits a component supplying instruction to tape feeder 6, controls mounting head 4 and the head moving mechanism, extracts the component supplied to the component extraction position by tape feeders 6, by mounting head 4, and performs a component mounting operation of moving and mounting the component to a mounting point of board 3 held by board transport mechanism 2. In this way, tape feeders 6 are component supply devices that supply the component stored in carrier tape 7 to component mounting device 1. Operable/closeable body cover 11 that covers a movable mechanism such as mounting head 4 such that the worker does not touch the movable mechanism during the component mounting operation is installed above carriage 5.

In FIG. 1, collection box 12 that collects empty carrier tape 7 discharged from a rear side of tape feeders 6 to which the component is extracted by mounting head 4 is installed at a lower portion of carriage 5. Discharge chute 13 that guides empty carrier tape 7 discharged from tape feeders 6 to collection box 12 is installed on a rear side of carriage 5. Cutter 14 that cuts empty carrier tape 7 at a predetermined length is installed in discharge chute 13. Empty carrier tape 7 discharged from tape feeders 6 is cut by cutter 14 and is collected in the collection box 12.

Next, a configuration and a function of tape feeders 6 will be described with reference to FIG. 2. Tape guideway 20 that guides carrier tape 7 pulled out from reel 8 and taken in each of tape feeders 6 is provided inside tape feeder 6. Tape guideway 20 is provided to communicate from insertion port 20a opened on an upstream side (a left side of FIG. 2) of the tape feeding direction to discharge port 20b opened on a downstream side (a right side of FIG. 2) of the tape feeding direction, in tape feeder 6. Component extraction position P where the component is extracted by mounting head 4 is provided in tape guideway 20.

While the component mounting operation is continuously executed, plurality of carrier tapes 7 each having a storage amount of one reel 8 as a unit lot are sequentially inserted from insertion ports 20a and are supplied to tape feeders 6. Hereinafter, among two carrier tapes 7 inserted from insertion ports 20a and fed forward and rearward, previously fed carrier tape 7 is called leading tape 7p, and carrier tape 7 fed after leading tape 7p is called following tape 7s (see FIG. 4). That is, tape guideway 20 has insertion port 20a through which leading tape 7p and following tape 7s can be inserted.

Figure 2:
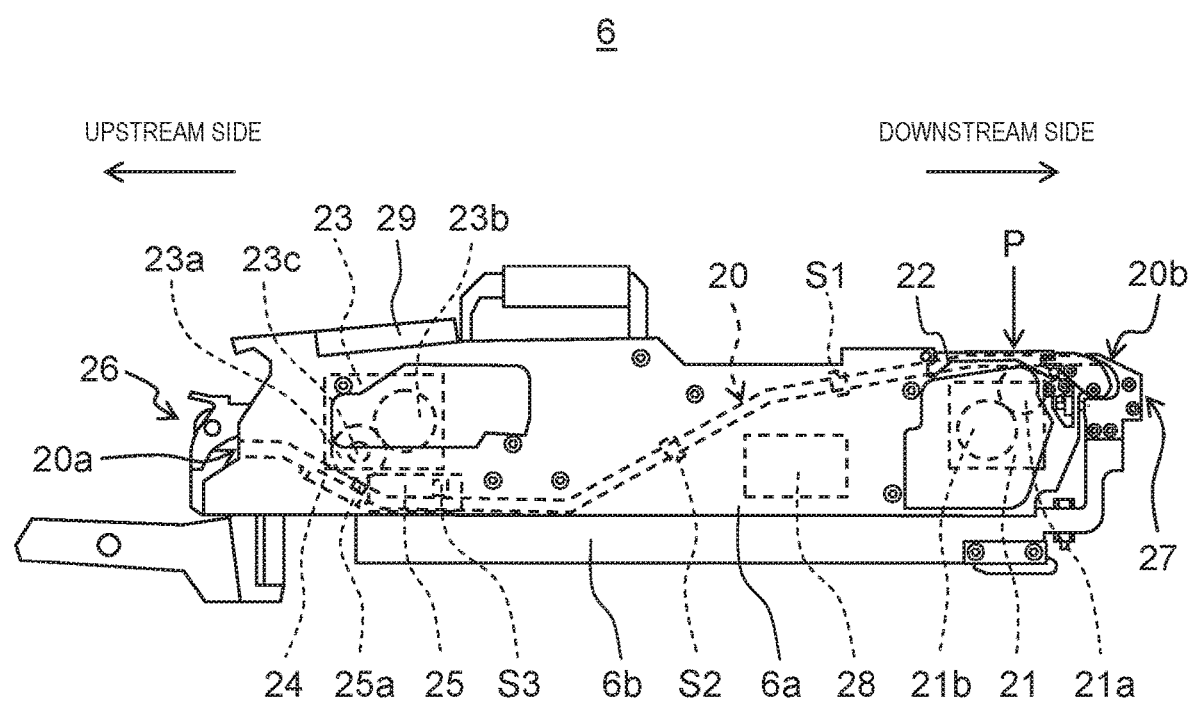
FIG. 2 is a diagram illustrating a configuration of a component supply device according to the embodiment of the present disclosure.

In FIG. 2, first tape transporter 21 that transports leading tape 7p to component extraction position P is provided on a downstream side of the tape guideway 20. First tape transporter 21 includes first sprocket 21a engaged with leading tape 7p and first motor 21b that rotationally drives first sprocket 21a. Tape cover 22 having a peeling blade for pressing leading tape 7p from above and exposing the component stored in leading tape 7p is mounted on first tape transporter 21. An opening portion is formed in a position corresponding to component extraction position P of tape cover 22. When carrier tape 7 travels along a lower surface of tape cover 22 by sprocket 21a, the component is exposed by the peeling blade, and the exposed component is transported to an opening portion formed on a downstream side thereof, that is, component extraction position P.

In FIG. 2, second tape transporter 23 that transports following tape 7s inserted from insertion port 20a to first tape transporter 21 is provided on an upstream side of tape guideway 20. Second tape transporter 23 includes second sprocket 23a engaged with following tape 7s and second motor 23b that rotationally drives second sprocket 23a. Second sprocket 23a has encoder 23c therein as rotation detecting means. Tape pressing mechanism 24 and tape stopper mechanism 25 are provided below second tape transporter 23.

The following tape 7s inserted into insertion port 20a is pressed against second sprocket 23a and engaged with second sprocket 23a by tape pressing mechanism 24, and becomes a tape feedable state. As second sprocket 23a engaged with following tape 7s rotates, encoder 23c detects that following tape 7s is engaged with second sprocket 23a. Tape stopper mechanism 25 has a function in which leading tape 7p passes through a downstream side without stopping, and a tip end portion of following tape 7s repeatedly inserted onto leading tape 7p is temporarily stopped by stopper member 25a.

In FIG. 2, following tape holder 26 that holds an uninserted portion of following tape 7s, not inserted into insertion port 20a, at a position separated upward from an uninserted portion of leading tape 7p is provided on an upstream side of insertion port 20a. Here, following tape 7s is inserted into insertion port 20a while overlapping on leading tape 7p. Details of a configuration of following tape holder 26 will be described below. Curling habit corrector 27 that corrects a curling habit of empty carrier tape (hereinafter, referred to "empty tape 7e") discharged from discharge port 20b from which the component is extracted, while guiding empty tape 7e to lower discharge chute 13, is provided on a downstream side of discharge port 20b. Details of a configuration of curling habit corrector 27 will be described below.

In FIG. 2, first sensor S1 that detects whether or not there is carrier tape 7 is disposed on an upstream side of first tape transporter 21 in tape guideway 20. Similarly, second sensor S2 that detects whether or not there is the same carrier tape 7 is disposed on an upstream side of first sensor S1 on a downstream side of second tape transporter 23. Tape stopper mechanism 25 includes third sensor S3 that detects whether or not following tape 7s is in contact with stopper member 25a.

A result of the detection by first sensor S1, second sensor S2, and third sensor S3 is transmitted to feeder controller 28 of tape feeder 6. Attachment 6b is mounted on a lower surface of base portion 6a of tape feeder 6. When tape feeder 6 is mounted on carriage 5 through attachment 6b, feeder controller 28 is electrically connected to mounting controller 10 through carriage 5.

Figure 3:
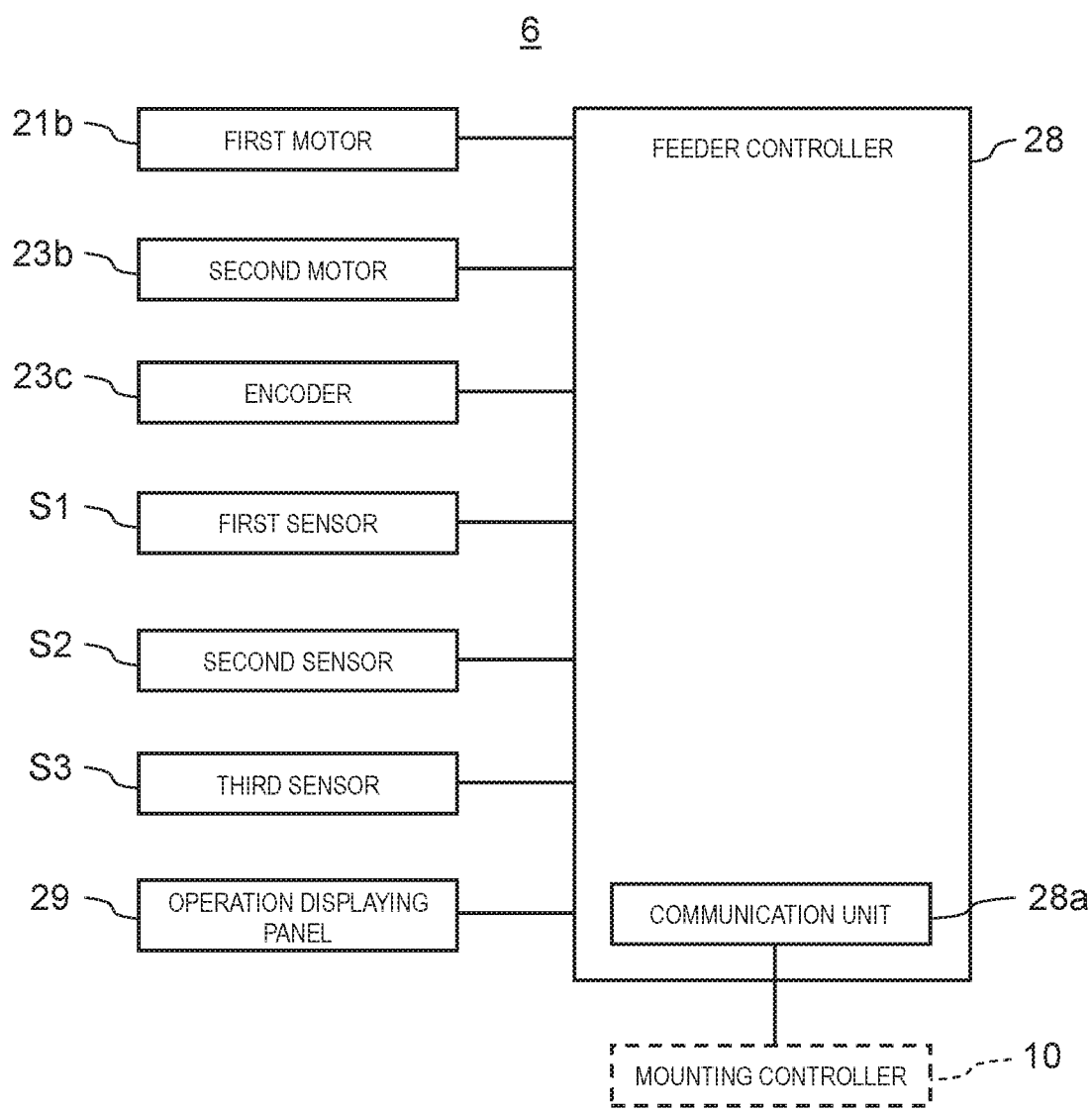
FIG. 3 is a block diagram illustrating a configuration of a control system of the component supply device according to the embodiment of the present disclosure.

In FIG. 2, operation displaying panel 29 connected to feeder controller 28 is installed on an upper surface of an upstream side of tape feeder 6 (see FIG. 3). Display means such as a light emitting diode (LED) that notifies the worker of predetermined contents together with an operation button that performs a predetermined operation input by the worker is provided in operation displaying panel 29. The worker can identify an operation state of tape feeder 6 and perform operation input of a predetermined item, with operation displaying panel 29.

Next, a configuration of a control system of tape feeder 6 will be described with reference to FIG. 3. Feeder controller 28 of tape feeder 6 includes communication unit 28a. Communication unit 28a is a communication interface, and performs transmission/reception of a signal and data to/from mounting controller 10 of component mounting device 1. Feeder controller 28 controls first motor 21b and second motor 23b based on the result of the detection by encoder 23c, first sensor S1, second sensor S2, and third sensor S3, and performs a tape feeding operation of leading tape 7p and following tape 7s according to a predetermined control pattern.

Here, the tape feeding operation of tape feeder 6 will be described with reference to FIG. 2. First, the worker inserts leading tape 7p into insertion port 20a while carrier tape 7 is not supplied to tape feeder 6. When the inserted leading tape 7p reaches second sprocket 23a, leading tape 7p is engaged with second sprocket 23a.

When encoder 23c detects that leading tape 7p is engaged with second sprocket 23a, feeder controller 28 rotationally drives second motor 23b, and transports leading tape 7p to first tape transporter 21. When the worker operates operation displaying panel 29, feeder controller 28 may transport leading tape 7p to first tape transporter 21. When leading tape 7p reaches first tape transporter 21, feeder controller 28 sets second motor 23b to an idle mode, and rotationally drives first motor 21b to pitch-feed leading tape 7p at a predetermined pitch.

When following tape 7s is replenished while the component is supplied from the leading tape 7p, the worker inserts following tape 7s into insertion port 20a through following tape holder 26. When the inserted following tape 7s reaches second sprocket 23a, following tape 7s is engaged with second sprocket 23a. When encoder 23c detects that following tape 7s is engaged with second sprocket 23a, feeder controller 28 rotationally drives second motor 23b, and transports following tape 7s to the downstream side. When third sensor S3 detects that a tip end portion of following tape 7s transported to the downstream side comes into contact with stopper member 25a, feeder controller 28 stops driving of second motor 23b.

When the component is continuously supplied from the leading tape 7p, and a tail end portion of leading tape 7p passes through tape stopper mechanism 25, tape stopper mechanism 25 releases the stop of following tape 7s by stopper member 25a. Next, when the tail end portion of leading tape 7p reaches second sensor S2, feeder controller 28 rotationally drives second motor 23b, and transports following tape 7s until a tip end portion of following tape 7s reaches second sensor S2. Thereafter, feeder controller 28 transports following tape 7s to a downstream side according to the pitch feeding of leading tape 7p until the tail end portion of leading tape 7p reaches first sensor S1.

When the tail end portion of leading tape 7p reaches first sensor S1, feeder controller 28 rotationally drives second motor 23b, and transports following tape 7s until the tip end portion of following tape 7s reaches first sensor S1. When the supply of the component from leading tape 7p is completed and leading tape 7p passes through first tape transporter 21, feeder controller 28 rotationally drives second motor 23b, and transports following tape 7s to first tape transporter 21. Hereafter, following tape 7s becomes the leading tape 7p, and the component is supplied.

Figure 7:
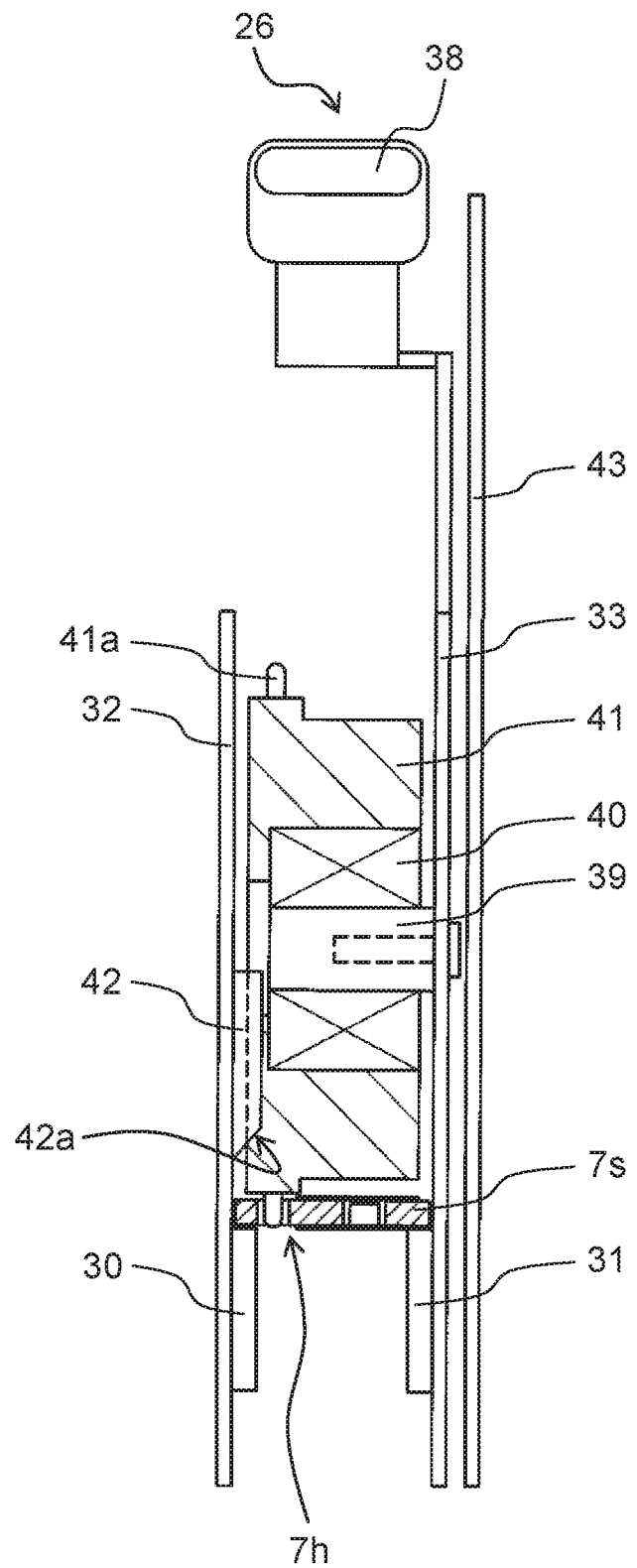
FIG. 7 is a diagram illustrating the configuration of the following tape holder in the component supply device according to the embodiment of the present disclosure.
Figure 8:
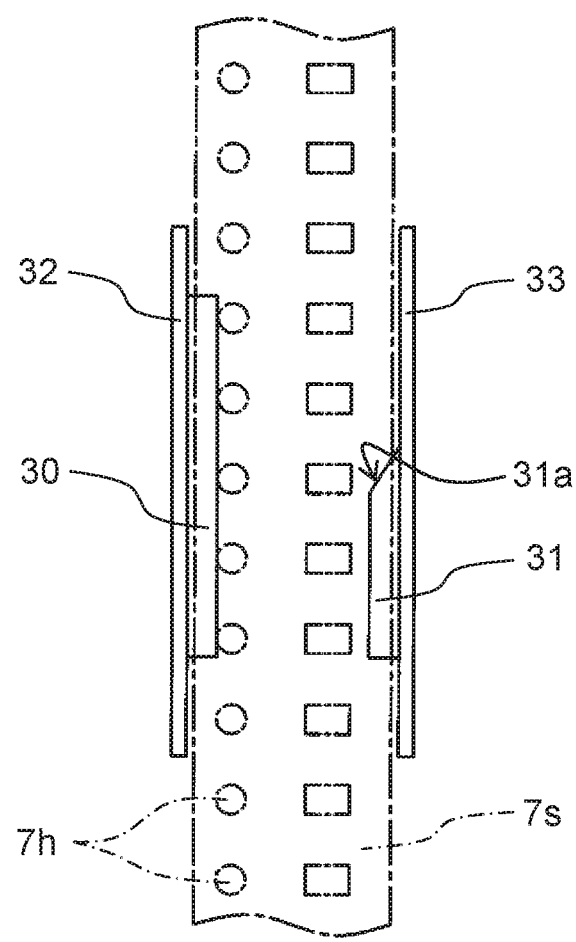
FIG. 8 is a diagram illustrating the configuration of the following tape holder in the component supply device according to the embodiment of the present disclosure.

Next, a configuration of following tape holder 26 will be described with reference to FIGS. 4 to 8. In FIGS. 6 to 8, following tape holder 26 includes first supporter 30 that supports one side of following tape 7s in a width direction from the lower side, and second supporter 31 that supports the other side of following tape 7s from the lower side. Hereinafter, for convenience, one side of following tape 7s in the width direction is called a left side (a left side in FIG. 7) and the other side of following tape 7s is called a right side (a right side in FIG. 7).

In FIGS. 6 to 8, first supporter 30 is formed on a right surface of plate-shaped member 32 spread in the tape feeding direction and a vertical direction (a Z direction). The right surface of plate-shaped member 32 is a guide surface that guides a left surface of following tape 7s. Plate-shaped member 32 is fixed to base portion 6a (see FIG. 5) of tape feeder 6. Second supporter 31 is formed on a left surface of plate-shaped movable member 33 spread in the tape feeding direction and the vertical direction. The left surface of movable ember 33 is a guide surface that guides a right surface of following tape 7s.

Figure 5:
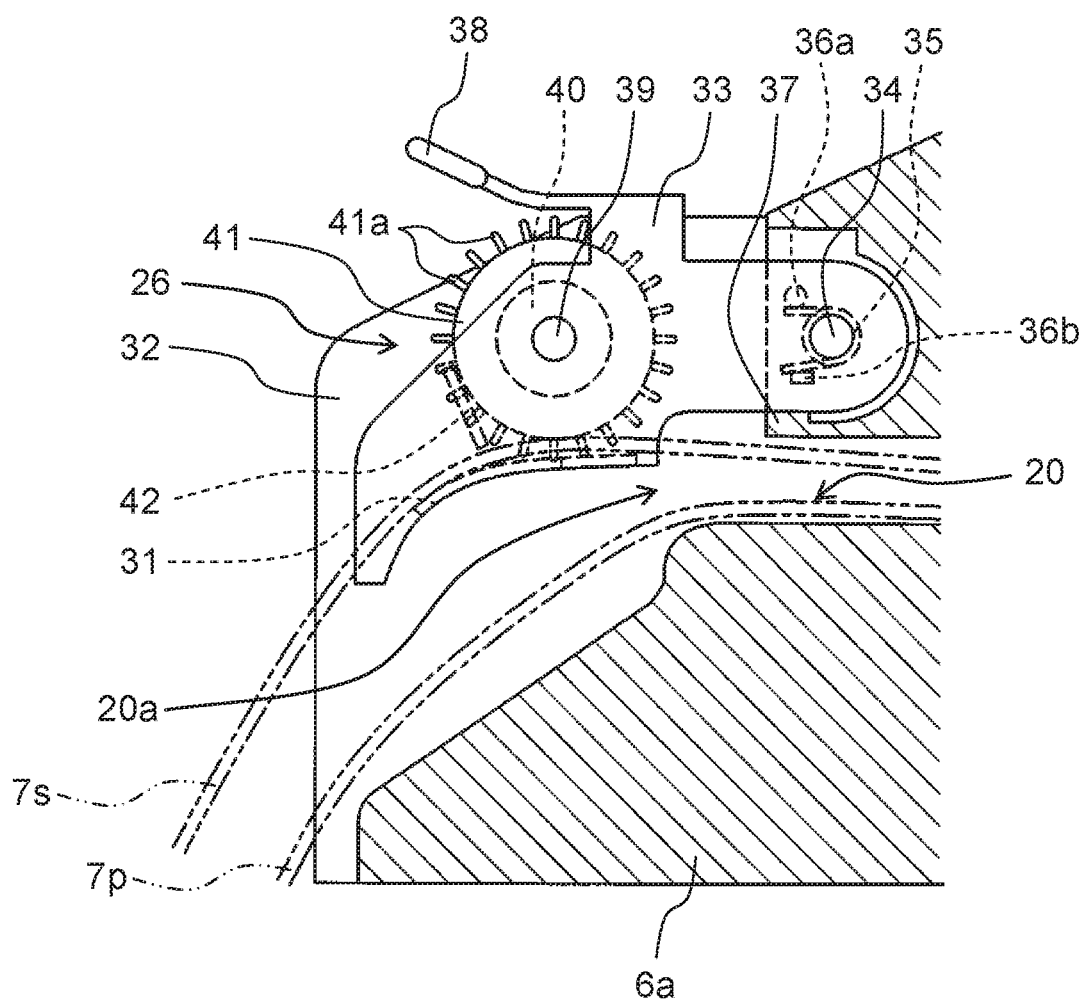
FIG. 5 is a diagram illustrating the configuration of the following tape holder in the component supply device according to the embodiment of the present disclosure.
Figure 6:
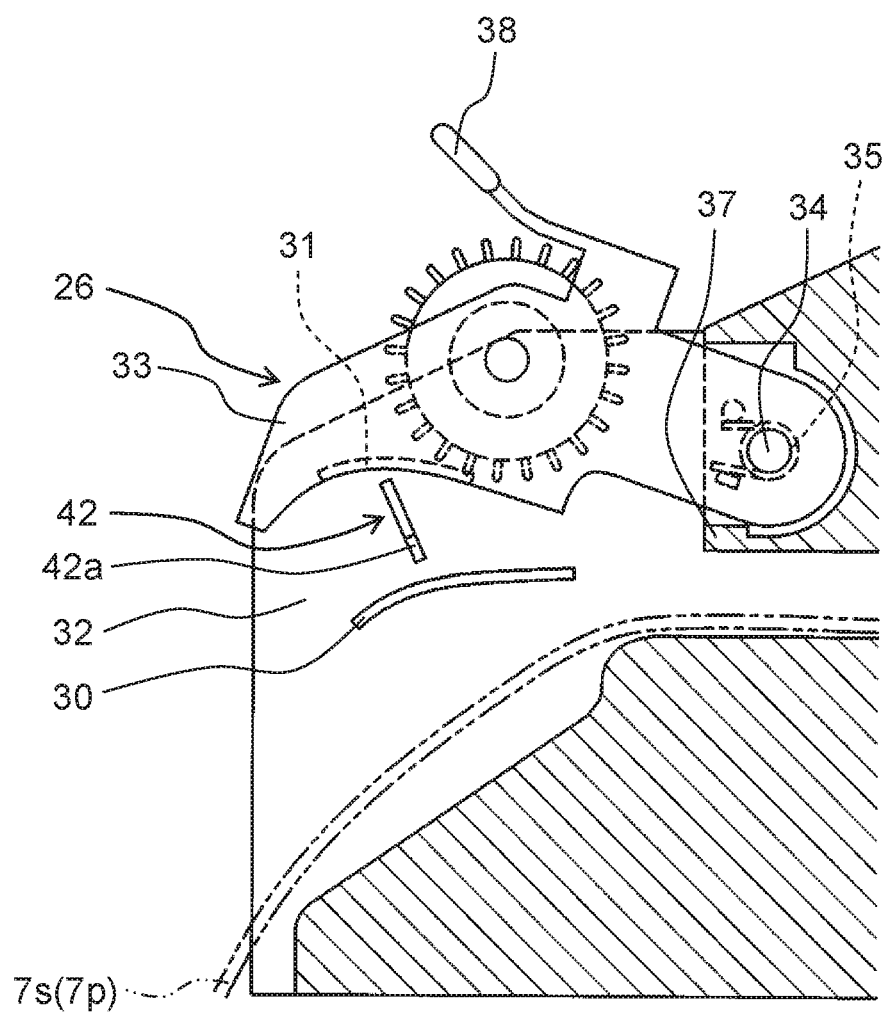
FIG. 6 is a diagram illustrating a function of the following tape holder in the component supply device according to the embodiment of the present disclosure.

In FIGS. 5 and 6, a downstream side of movable member 33 is swingably connected a horizontal shaft 34 having a rotation center that is parallel to a width direction of following tape 7s. That is, movable member 33 is formed to vertically swing about horizontal shaft 34. Coiled torsion spring 35 is mounted on horizontal shaft 34. One end of torsion spring 35 is connected to first spring retainer 36a fixed to base portion 6a, and the other end of torsion spring 35 is connected to second spring retainer 36b fixed to movable member 33. In this way, an upstream side of movable member 33 is downward urged by torsion spring 35. In the present embodiment, although the upstream side of movable member 33 is downward urged by torsion spring 35, another type of spring such as a tension spring may be used instead of torsion spring 35.

Stopper 37 that regulates downward displacement of movable member 33 as an upper surface of base portion 6a comes into contact with a lower surface of movable member 33, to position second supporter 31 formed in movable member 33 at the same height as first supporter 30, is formed in base portion 6a. That is, following tape holder 26 includes a spring (torsion spring 35) that downward urges the upstream side of movable member 33 and stopper 37 that regulates the downward displacement of movable member 33 to position second supporter 31 at the same height as first supporter 30.

Operation unit 38 including a lever that the worker operates with a finger is formed at an upper portion of movable member 33. As the worker lifts up operation unit 38, the upstream side of movable member 33 can be lifted up (see FIG. 6). In this way, movable member 33 can be displaced vertically with respect to the fixed plate-shaped member 32 (see FIGS. 9A to 9D).

In FIG. 7, rotary shaft 39 having a horizontal rotation center in the width direction of following tape 7s is fixed to movable member 33. Third sprocket 41 is installed in rotary shaft 39 through one-way clutch 40. Plurality of pins 41a are provided on a left side (that is, on a side close to plate-shaped member 32) of an outer peripheral surface of third sprocket 41. In a state in which movable member 33 is in contact with stopper 37, pins 41a of third sprocket 41 are engaged with feed holes 7h formed in following tape 7s, a lower surface of which is supported on first supporter 30 and second supporter 31.

That is, first supporter 30 supports a side of following tape 7s on a side where feed holes 7h are formed, from below. Third sprocket 41 mounted on horizontal rotary shaft 39 through one-way clutch 40 constitutes a locking portion that is engaged with feed holes 7h of following tape 7s and locks following tape 7s on first supporter 30.

When following tape 7s engaged with third sprocket 41 moves toward insertion port 20a on following tape holder 26, one-way clutch 40 allows rotation of third sprocket 41, but does not permit rotation in a reverse direction. Accordingly, following tape 7s can be prevented from being separated from tape feeder 6. In this way, third sprocket 41 mounted on horizontal rotary shaft 39 through one-way clutch 40 is mounted on movable member 33.

In FIGS. 6 and 7, protrusion 42 protruding upward from first supporter 30 is formed at a position separated upward from first supporter 30 on the right surface of plate-shaped member 32. Taper 42a having an inclined surface approaching the right surface of plate-shaped member 32 to the lower side (an inclined surface separated from the right surface of plate-shaped member 32 toward upward) is formed at a lower end portion of protrusion 42. That is, the width of the lower end portion of protrusion 42 in a horizontal direction becomes narrower as protrusion 42 goes downward.

Figure 4:
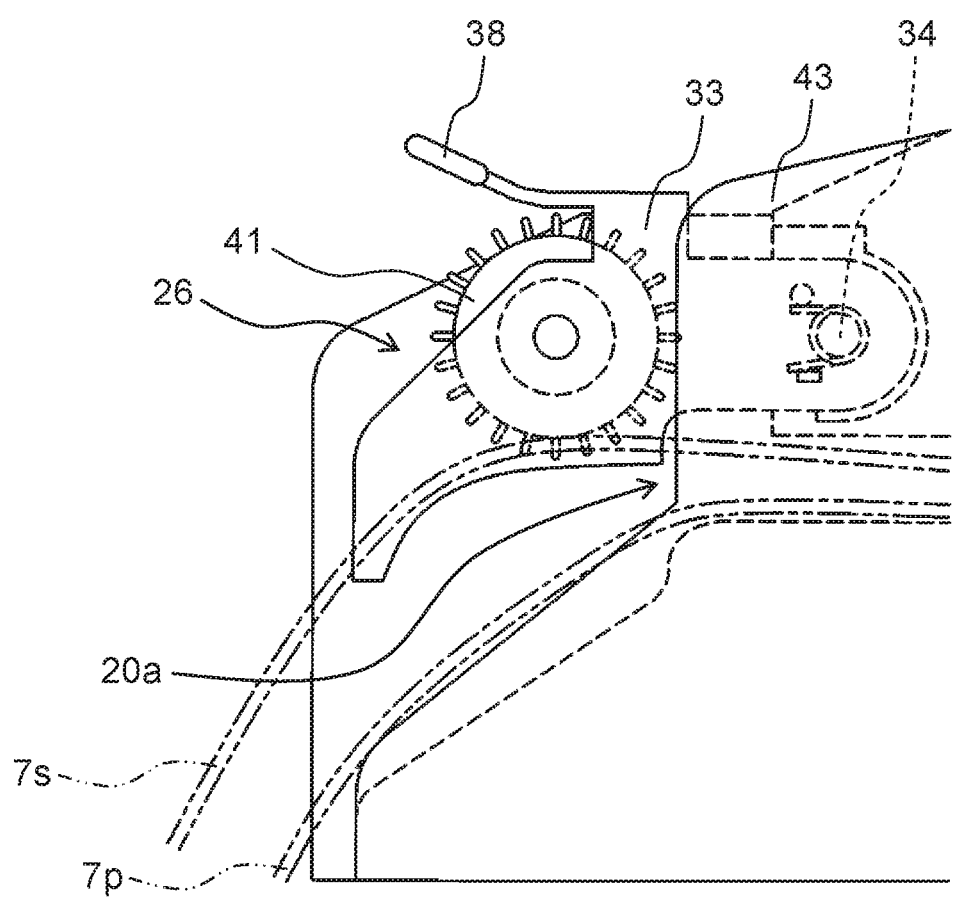
FIG. 4 is a diagram illustrating a configuration of a following tape holder in the component supply device according to the embodiment of the present disclosure.

In FIG. 8, a position of a downstream end portion of second supporter 31 is located upstream of a position of a downstream end portion of first supporter 30. Further, a notch portion 31a having an inclined surface approaching the right surface of movable member 33 as the notch portion 31a goes toward the downstream side is formed on a downstream side of second supporter 31. That is, the width of one end portion of second supporter 31, close to insertion port 20a (a downstream side), in the horizontal direction decreases toward insertion port 20a side. In FIGS. 4 and 7, side cover 43 fixed to base portion 6a is provided on a right side of movable member 33, and covers the periphery of horizontal shaft 34.

Figure 9A:
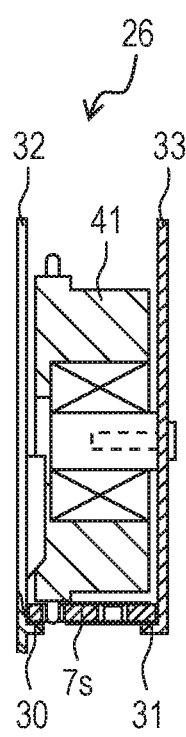
FIG. 9A is a diagram illustrating the function of the following tape holder in the component supply device according to the embodiment of the present disclosure.

Next, a function of detaching the uninserted portion of following tape 7s from following tape holder 26 will be described with reference to FIGS. 9A to 9D. In FIG. 9A, in a state in which movable member 33 is in contact with stopper 37 and second supporter 31 is located at the same height position as first supporter 30, following tape 7s is held by following tape holder 26. When the uninserted portion of following tape 7s is detached from following tape holder 26, the worker lifts up operation unit 38 while holding operation unit 38. Accordingly, movable member 33 moves upward while being integrated with second supporter 31 and third sprocket 41.

Figure 9B:
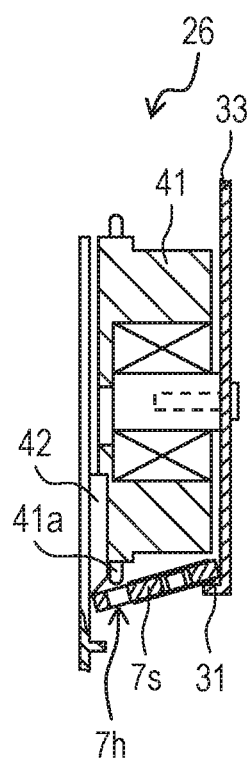
FIG. 9B is a diagram illustrating the function of the following tape holder in the component supply device according to the embodiment of the present disclosure.
Figure 9C:
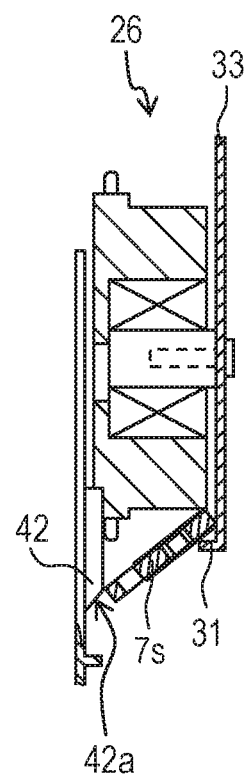
FIG. 9C is a diagram illustrating the function of the following tape holder in the component supply device according to the embodiment of the present disclosure.

In FIG. 9B, as movable member 33 rises, following tape 7s moves upward while a lower surface of the right side of following tape 7s is supported by second supporter 31, and a left side of following tape 7s comes into contact with protrusion 42. Further, when movable member 33 rises, pins 41a of third sprocket 41 are separated from feed holes 7h of following tape 7s. In FIG. 9C, further, when following tape 7s rises together with movable member 33, following tape 7s is pushed by taper 42a of protrusion 42, and is twisted in a counterclockwise direction while being displaced to a position (a right side) not overlapping with first supporter 30.

Figure 9D:
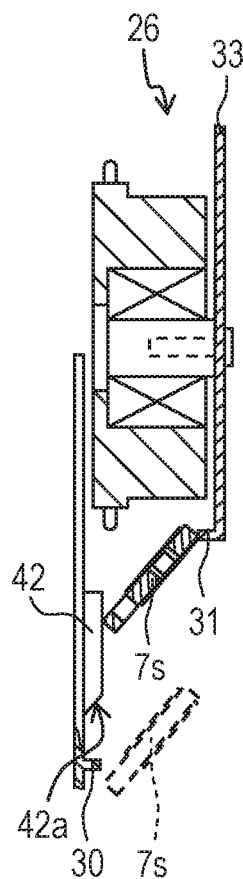
FIG. 9D is a diagram illustrating the function of the following tape holder in the component supply device according to the embodiment of the present disclosure.

In FIG. 9D, when the movable member 33 further rises, the twist of following tape 7s increases, and after a while, a right end portion of following tape 7s deviates and is dropped from second supporter 31. At this time, the right end portion of following tape 7s deviates and is dropped from the notch portion 31a on the downstream side of second supporter 31 as a starting point. Further, since a left end portion of following tape 7s is displaced to the right side by protrusion 42, following tape 7s is dropped downward without being caught by first supporter 30 (as indicated by a dotted line in the drawing).

The following tape 7s detached from following tape holder 26 moves to a position of a lower end where leading tape 7p exists previously (see FIG. 6). The detachment of the uninserted portion of following tape 7s from following tape holder 26 is performed before the supply of the component from leading tape 7p is completed and a next carrier tape 7 is inserted. When following tape 7s (a next leading tape 7p) is detached, the next carrier tape 7 (a next following tape 7s) is inserted into following tape holder 26.

That is, movable member 33, in which second supporter 31 and a guide surface that guides the other side surface of following tape 7s in the width direction are formed and which can be vertically displaced with respect to plate-shaped member 32, constitutes a displacer that detaches and drops the uninserted portion of following tape 7s from following tape holder 26. Then, the displacer displaces a position of second supporter 31 upward with respect to first supporter 30, and detaches the uninserted portion of following tape 7s from following tape holder 26. Further, in the displacer, the locking portion (third sprocket 41) is mounted on movable member 33, and in the displacer, the locking portion also moves away from first supporter 30 together with second supporter 31.

In this way, tape feeder 6 includes tape guideway 20, first tape transporter 21, second tape transporter 23, first supporter 30 supports the one side of the uninserted portion of following tape 7s in the width direction from the lower side, second supporter 31 that supports the other side of the uninserted portion of following tape 7s from the lower side, following tape holder 26 that holds following tape 7s at the position separated upward from the uninserted position of the leading tape 7p, and the displacer (movable member 33) that displaces the position of second supporter 31 upward with respect to first supporter 30, and detaches and drops the uninserted portion of following tape 7s from following tape holder 26. In other words, the displacer displaces the uninserted portion of following tape 7s from following tape holder 26. At least the width of the one end portion of insertion port 20a side of second supporter 31 in the horizontal direction decreases toward insertion port 20a side. Accordingly, an operation of replenishing following tape 7s to tape feeder 6 can be optimized.

Figure 10:
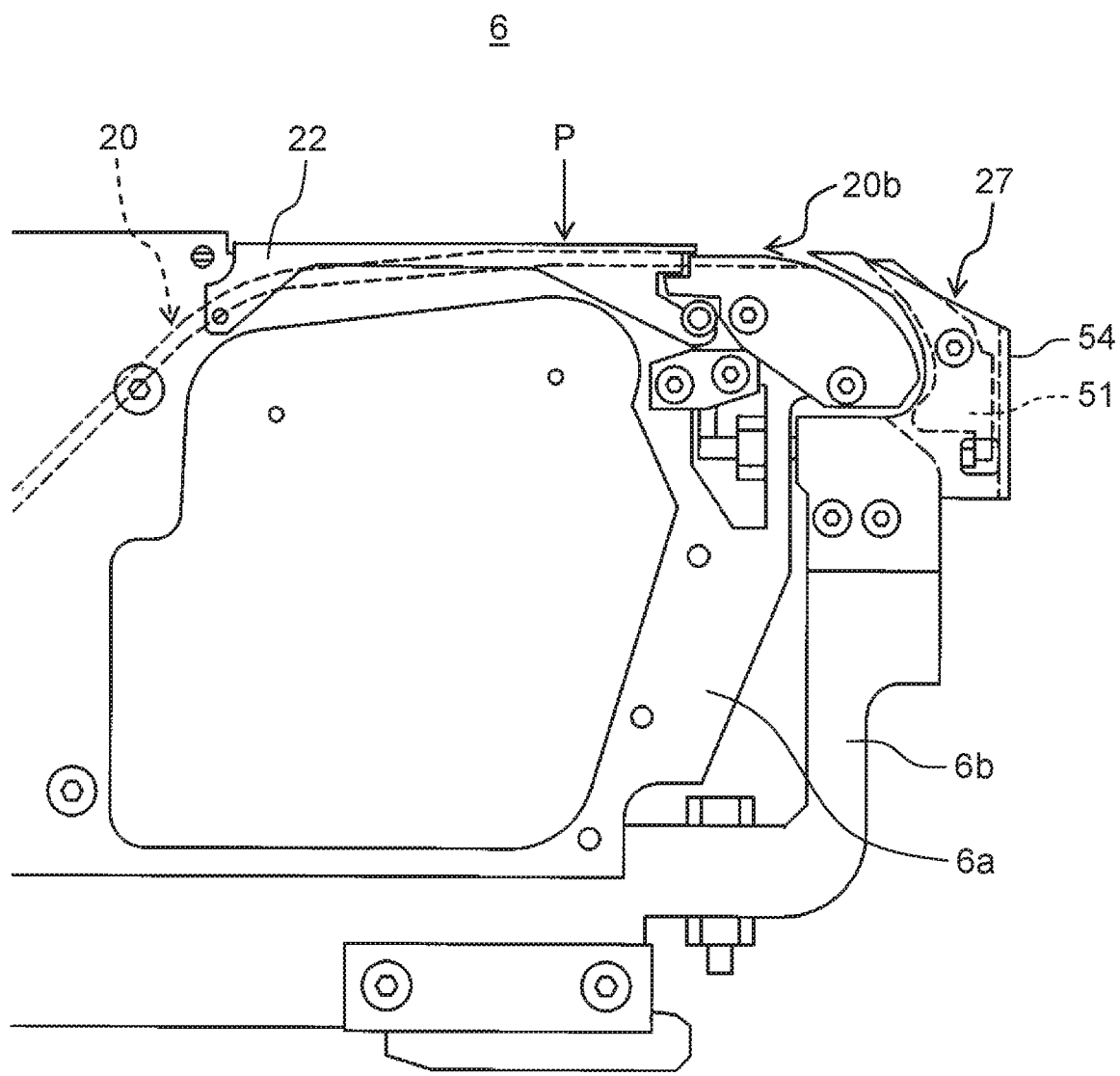
FIG. 10 is a diagram illustrating a configuration of a curling habit corrector in the component supply device according to the embodiment of the present disclosure.
Figure 11:
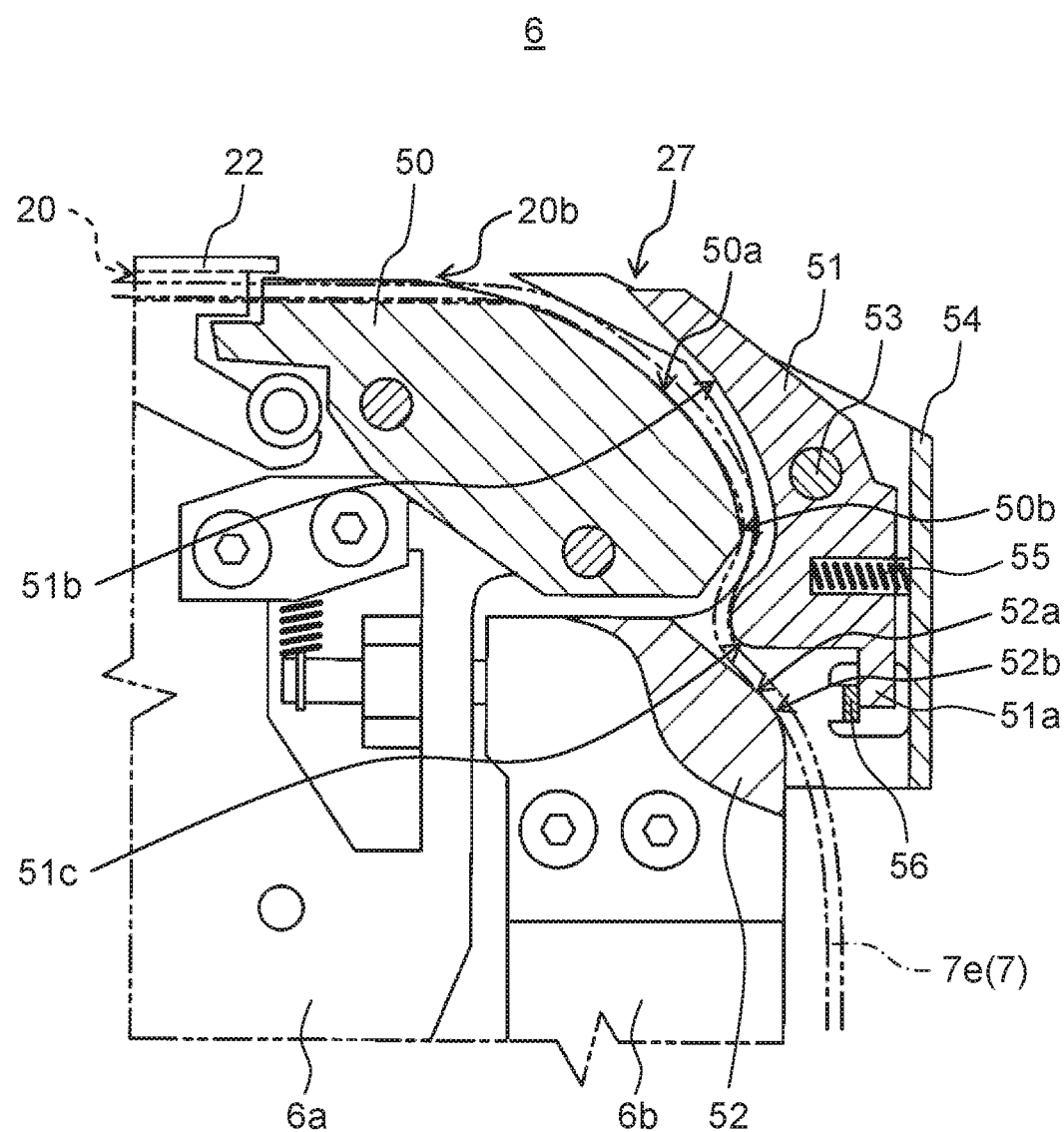
FIG. 11 is a diagram illustrating a function of the curling habit corrector in the component supply device according to the embodiment of the present disclosure.

A configuration and a function of curling habit corrector 27 will be described with reference to FIGS. 10 to 12. In FIGS. 10 and 11, while empty tape 7e discharged from discharge port 20b from which the component is extracted is guided to lower discharge chute 13 in component extraction position P, curling habit corrector 27 functions to correct the curling habit (a curl) attached to carrier tape 7 while carrier tape 7 is stored in reel 8. In FIG. 10, attachment 6b is mounted on a lower surface of base portion 6a. A downstream side of attachment 6b rises along a downstream side of base portion 6a.

In FIG. 11, curling habit corrector 27 includes first member 50, second member 51, and third member 52, and a guide path through which empty tape 7e is guided to discharge chute 13 is formed by first member 50, second member 51, and third member 52. Third member 52 is an upper end portion of attachment 6b. First member 50 has first guide surface 50a that is fixed to base portion 6a of tape feeder 6, is in contact with a lower surface of empty tape 7e discharged from discharge port 20b in the horizontal direction, and guides empty tape 7e to the lower side. The lower surface of empty tape 7e directed to the lower side while being guided by first guide surface 50a is detached from first guide surface 50a by first contact portion 50b formed on first guide surface 50a.

In FIGS. 10 and 11, front cover 54 is mounted on an upper end portion of attachment 6b. Second member 51 is swingably mounted on an inner space surrounded by front cover 54 by swing shaft 53 that is parallel to the width direction of empty tape 7e. Second member 51 is urged in a clockwise direction by compression spring 55 that is an elastic body disposed between second member 51 and front cover 54. Protrusion 51a protruding downward is formed at a lower end portion of second member 51. Stop member 56 (a stopper) that regulates oscillation of second member 51 in the clockwise direction by coming into contact with protrusion 51a is provided in front cover 54.

Second guide surface 51b that is in contact with an upper surface of empty tape 7e discharged from discharge port 20b in the horizontal direction and guides empty tape 7e to the lower side is provided on a side surface of second member 51, facing first member 50. First guide surface 50a and second guide surface 51b constitute the guide path that guides empty tape 7e discharged from discharge port 20b to the lower side. Second guide surface 51b is a smooth curved surface curved toward base portion 6a as the curved surface goes downward. Second contact portion 51c is formed on second guide surface 51b located below second member 51 and below a portion mounted on swing shaft 53. Second contact portion 51c comes into contact with the upper surface of empty tape 7e, which is detached from first contact portion 50b and moves downward, and pushes empty tape 7e toward base portion 6a.

In FIG. 11, third member 52 is located below first member 50, and has third guide surface 52a coming into contact with a lower surface of empty tape 7e that is detached from second contact portion 51c and moves downward. Third guide surface 52a is inclined to be further away from base portion 6a as third guide surface 52a goes downward, and causes empty tape 7e, passing through the guide path formed by first guide surface 50a and second guide surface 51b, to be further away from base portion 6a. Second guide surface 51b and third guide surface 52a constitute a guide path through which empty tape 7e detached from second contact portion 51c is guided to the lower side.

The lower surface of empty tape 7e directed to the lower side while being guided by third guide surface 52a is detached from third guide surface 52a by third contact portion 52b formed in third guide surface 52a. Empty tape 7e detached from third contact portion 52b rushes into discharge chute 13, is cut at a predetermined length by cutter 14 located in the middle of discharge chute 13, and is collected in the collection box 12.

In this way, the first member, the second member, and the third member form a guide path in which the component is extracted by component mounting device 1, and through which empty tape 7e discharged from discharge port 20b in the horizontal direction is guided to the lower side and is guided to discharge chute 13. First contact portion 50b that is in contact with the lower surface of empty tape 7e, second contact portion 51c that is in contact with the upper surface of empty tape 7e, and third contact portion 52b that is in contact with the lower surface of empty tape 7e are disposed in the guide path in an order in which empty tape 7e passes side by side from above.

Curling habit corrector 27 includes a movable member (second member 51) including second contact portion 51c as a part and an elastic body (compression spring 55) that urges the movable member to the upper surface of empty tape 7e, and second contact portion 51c is freely displaced in a direction crossing a straight line connecting first contact portion 50b and third contact portion 52b. Accordingly, curling habit corrector 27 corrects the curling habit of empty tape 7e by curving empty tape 7e passing through the guide path, in a direction in which an upper surface of empty tape 7e becomes concave, by first contact portion 50b, second contact portion 51c, and third contact portion 52b.

Empty tape 7e having the curling habit is rolled and caught inside discharge chute 13, and stays in discharge chute 13. However, as the curling habit is corrected by curling habit corrector 27, empty tape 7e can be smoothly collected without being caught by discharge chute 13.

Figure 12:
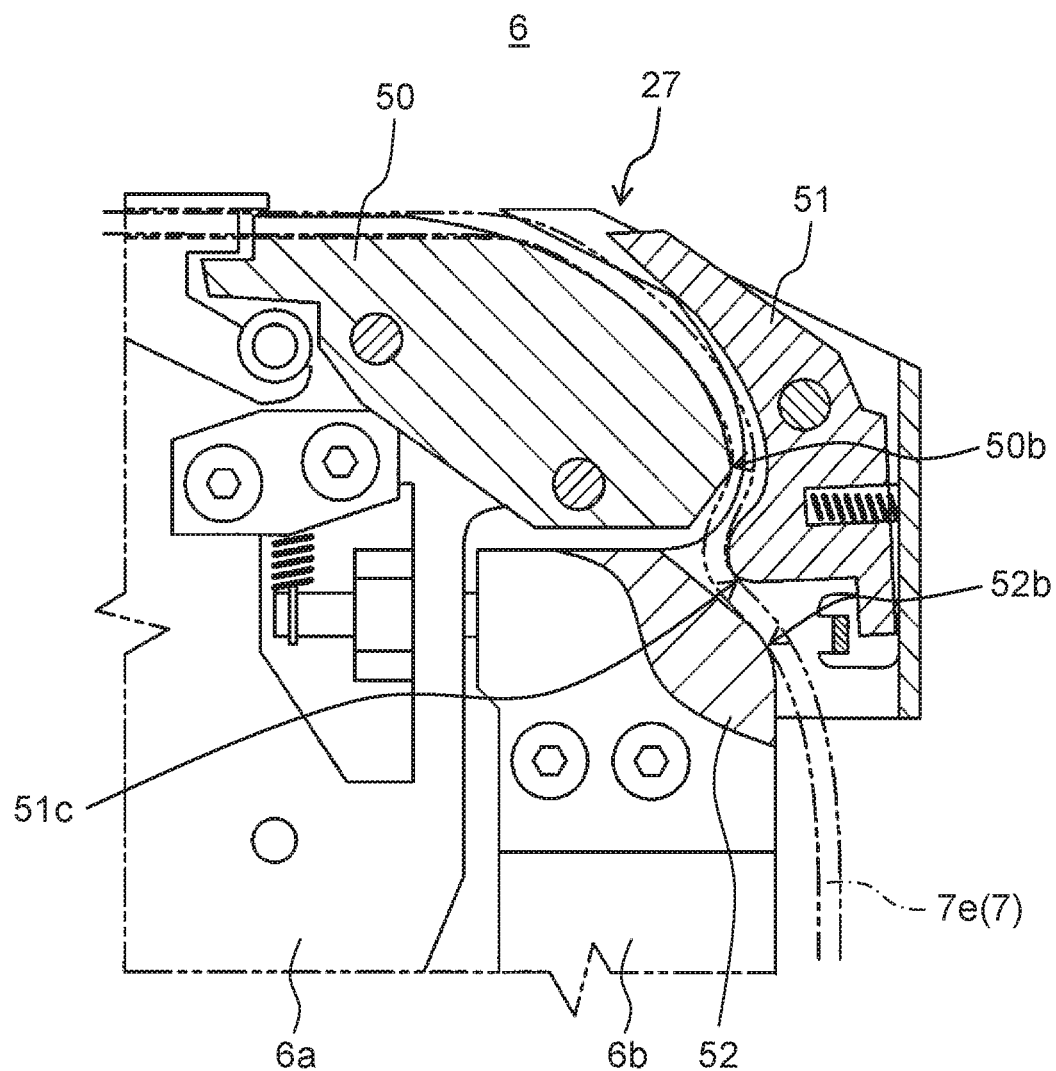
FIG. 12 is a diagram illustrating the function of the curling habit corrector in the component supply device according to the embodiment of the present disclosure.

FIG. 12 illustrates an example where empty tape 7e (carrier tape 7) that is thicker than empty tape 7e of FIG. 11 is discharged from discharge port 20b and is introduced into curling habit corrector 27. When thick empty tape 7e passes through second contact portion 51c, second member 51 is pushed by the upper surface of thick empty tape 7e and is displaced to be further away from base portion 6a. That is, as second contact portion 51c is displaced according to the thickness of empty tape 7e, second contact portion 51c can perform the correction by applying, to empty tape 7e, an appropriate force for curving empty tape 7e in a direction in which empty tape 7e becomes concave.

As described above, tape feeder 6 (the component supply device), which supplies the component stored in carrier tape 7 to component mounting device 1, includes curling habit corrector 27 that corrects the curling habit of empty tape 7e which is carrier tape 7 from which the component is extracted by component mounting device 1. Accordingly, carrier tape 7 having a large curling habit can be also collected smoothly.

Although the above-described curling habit corrector 27 is formed integrally with attachment 6b mounted on base portion 6a, curling habit corrector 27 is not limited to this configuration. That is, curling habit corrector ay be located at a position where empty tape 7e discharged from discharge port 20b in the horizontal direction is guided to lower discharge chute 13, between component extraction position P and cutter 14. Curling habit corrector 27 may be installed in a tape feeder using a method in which following tape 7s is joined to leading tape 7p with a splicing tape and is replenished.

Figure 13:
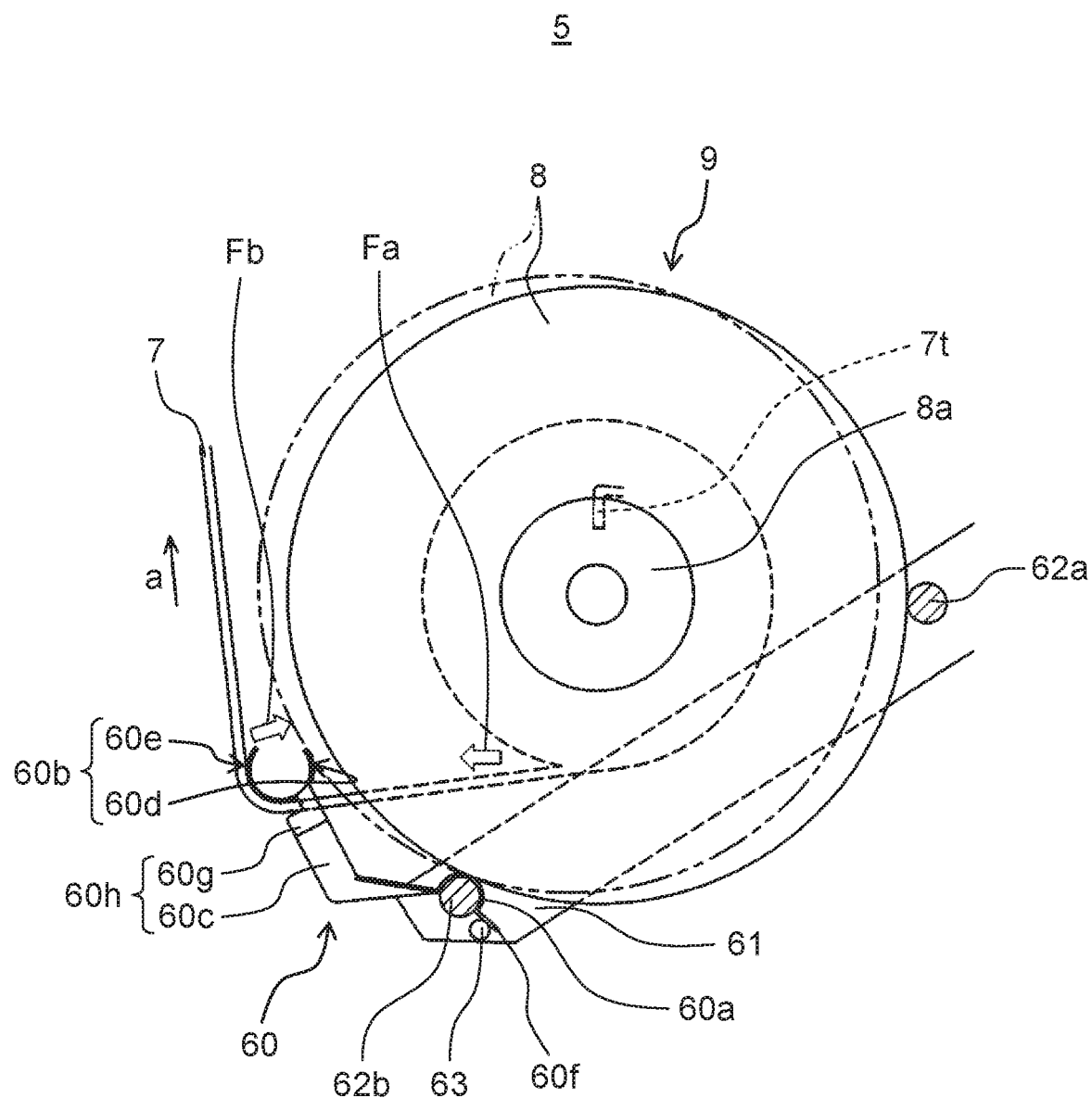
FIG. 13 is a diagram illustrating a configuration of a reel holder in a reel holding device according to the embodiment of the present disclosure.

Next, configurations and functions of reel holder 9 that holds reel 8 of carriage 5 and reel pressing member 60 that is mounted on reel holder 9 and prevents separation of reel 8 will be described with reference to FIGS. 13 and 14. In FIG. 13, in reel 8, carrier tape 7 into which terminal end portion 7t is inserted is wound around and stored in a part of an outer peripheral surface of reel core 8a. Terminal end portion 7t of carrier tape 7 supplied to tape feeder 6 and pulled out from reel 8 falls out from reel core 8a.

In FIG. 13, reel holder 9 includes pair of reel guides 61 that interpose reel 8 from opposite sides, and first reel supporting portion 62a and second reel supporting portion 62b that are located between pair of reel guides 61 and receive an outer periphery of reel 8 at two points. Among them, second reel supporting portion 62b located in a direction from which carrier tape 7 is pulled out (on a front side) is provided at a position that is lower than rear first reel supporting portion 62a, and facilitates an operation of inputting/outputting reel 8 into/from reel holder 9.

In FIG. 13, reel pressing member 60 includes connection portion 60a formed at one end portion thereof, tape guiding unit 60b formed at the other end portion thereof, and plate-shaped connection portion 60c connecting connection portion 60a and tape guiding unit 60b. Reel contact surface 60d and tape guide surface 60e are formed in tape guiding unit 60b. Connection portion 60a is engaged with second reel supporting portion 62b between pair of reel guides 61 in a detachable state. Accordingly, reel pressing member 60 is mounted on reel holder 9 in a detachable state. Further, reel pressing member 60 mounted on reel holder 9 is swingable about second reel supporting portion 62b.

Reel contact surface 60d is a curved surface, and is formed on a surface of tape guiding unit 60b, which is close to reel 8, in a state in which reel pressing member 60 is mounted on second reel supporting portion 62b. Tape guide surface 60e is a curved surface, and is formed on a surface of tape guiding unit 60b, which is opposite to reel 8, in a state in which reel pressing member 60 is mounted on second reel supporting portion 62b. Tape guide surface 60e guides carrier tape 7 pulled out from reel 8 held by reel holder 9, toward tape feeder 6 disposed above reel holder 9. Accordingly, carrier tape 7 pulled out from reel 8 held by reel holder 9 passes between connection portion 60a and tape guiding unit 60b, and is directed to tape feeder 6 by changing a route upward while a rear surface of carrier tape 7 follows tape guide surface 60e.

In FIG. 13, carrier tape 7 pulled out from reel 8 is drawn into tape feeder 6 (arrow a), and force Fa is applied to reel 8 held by reel holder 9 in a direction in which carrier tape 7 is pulled out. Further, force Fb that performs pivoting in a clockwise direction by a tensile force of carrier tape 7 is applied to reel pressing member 60.

Pivotal stopper 63 that is in contact with end portion 60f of reel pressing member 60 and regulates a position where tape guiding unit 60b approaches reel 8 is provided in each of reel guides 61. Accordingly, tape guiding unit 60b is not in contact with reel 8, and dust is prevented from being generated as tape guiding unit 60b and reel 8 that rotates by pulling out carrier tape 7 rub against each other. Pivotal stopper 63 may have a shape that can be engaged with reel pressing member 60, and may be, for example, a hole formed in reel guide 61 with which a protrusion formed in end portion 60f of reel pressing member 60 is engaged.

Figure 14:
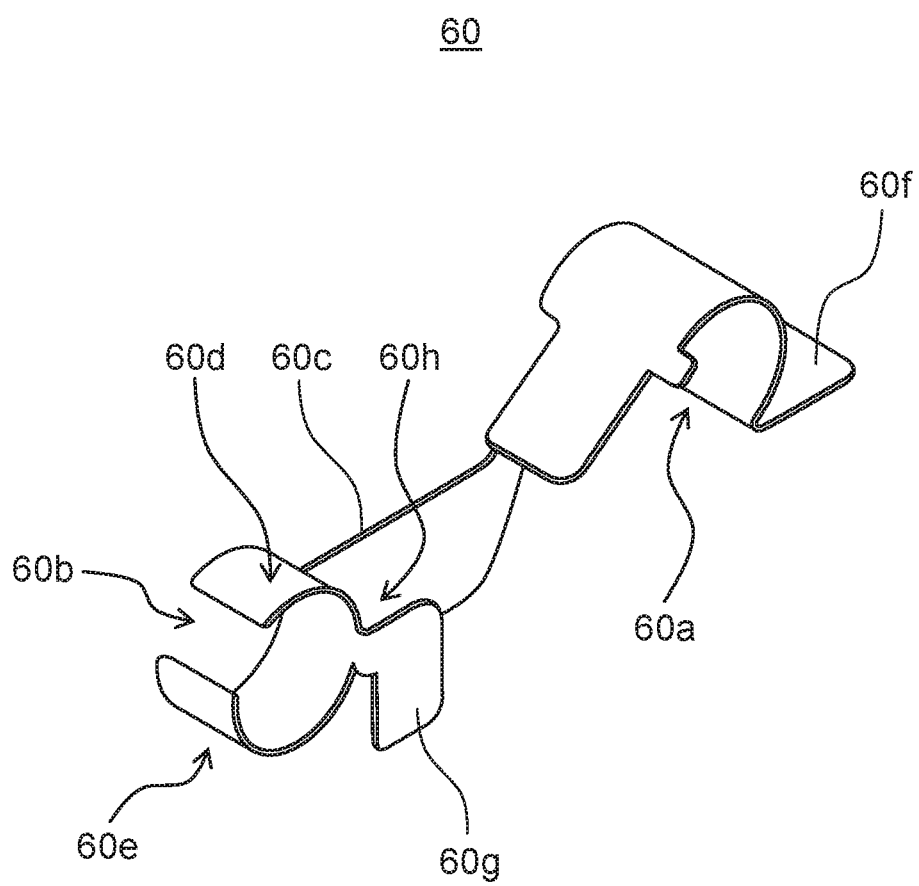
FIG. 14 is a diagram illustrating a configuration of a reel pressing member mounted on the reel holder in the reel holding device according to the embodiment of the present disclosure.

In FIGS. 13 and 14, plate-shaped side plate 60g is provided in tape guiding unit 60b at a position facing a side surface of connection portion 60c. Movement of carrier tape 7 pulled out from reel 8 and supplied to tape feeder 6 in a width direction is regulated by the side surface of connection portion 60c and the side surface of side plate 60g, and carrier tape 7 is fed to tape guide surface 60e without being separated from reel pressing member 60. That is, connection portion 60c and side plate 60g constitute separation preventing unit 60h that prevents carrier tape 7 from being separated from tape guide surface 60e.

When carrier tape 7 is pulled out by tape feeder 6, the weight of reel 8 is reduced, and reel 8 may be pulled by pulled-out carrier tape 7 and overcome second reel supporting portion 62b. However, reel 8 overcoming second reel supporting portion 62b comes into contact with reel contact surface 60d of tape guiding unit 60b, and movement of reel 8 is blocked at a position indicated by a two-dot chain line of FIG. 13. Accordingly, reel 8 is prevented from being separated from reel holder 9.

When carrier tape 7 is pulled out to expose terminal end portion 7t, and tape feeder 6 pulls carrier tape 7, terminal end portion 7t is pulled out from reel core 8a. Even in this case, although reel 8 is pulled by carrier tape 7 and overcomes second reel supporting portion 62b, the movement of reel 8 is prevented at the position indicated by the two-dot chain line of FIG. 13 by reel contact surface 60d, and reel 8 is prevented from being separated from reel holder 9.

As described above, carriage 5 that holds reel 8 on which carrier tape 7 storing the component supplied to component mounting device 1 is wound is a reel holding device including reel holder 9 that rotatably supports reel 8, and tape guiding unit 60b that is connected to reel holder 9, can come into contact with the outer periphery of reel 8, and comes into contact with the rear surface of carrier tape 7. Accordingly, reel 8 can be prevented from being separated at low costs. Further, as tape guiding unit 60b stops the movement of reel 8, terminal end portion 7t of carrier tape 7 can be surely pulled out from reel core 8a.

Figure 15:
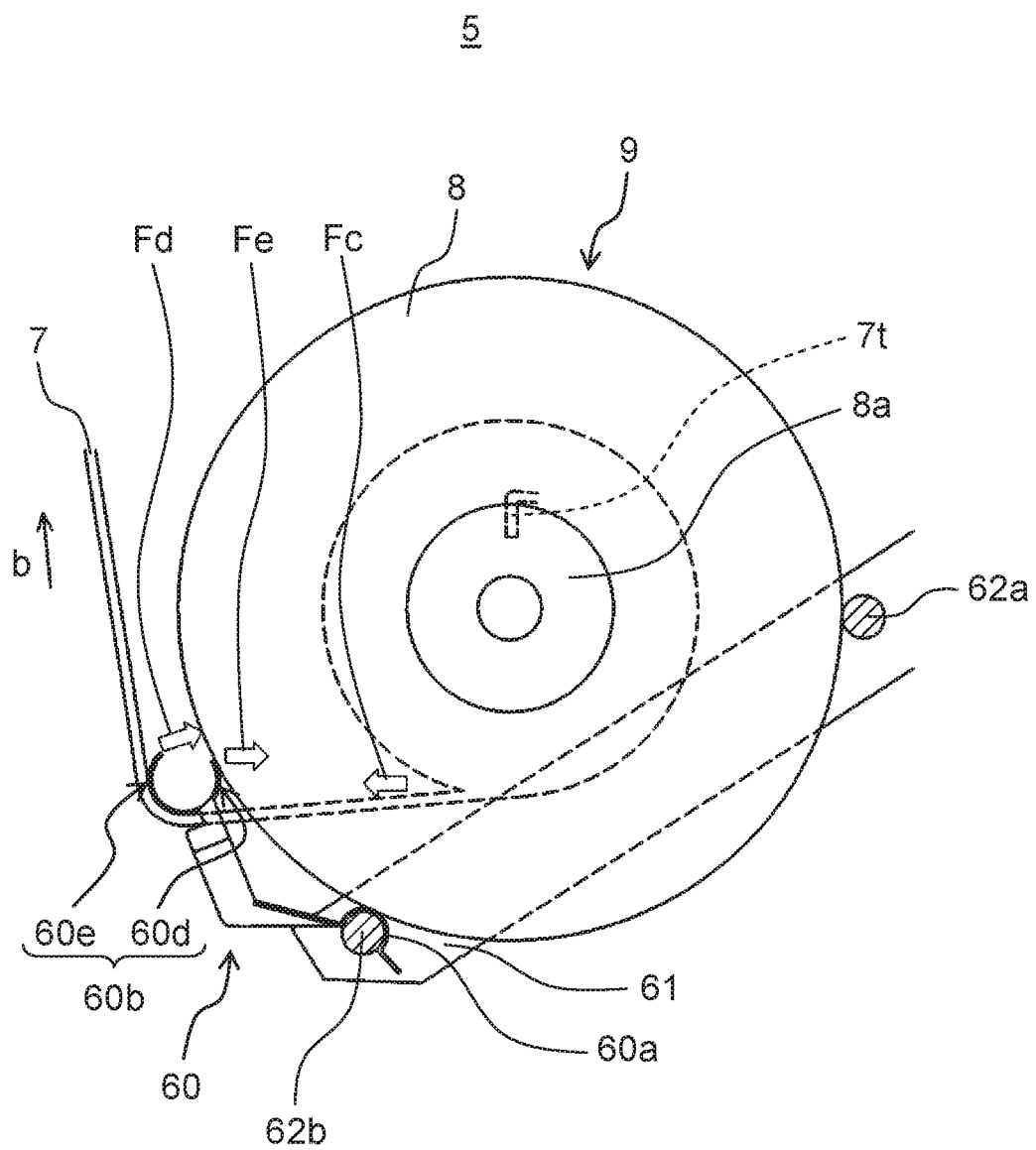
FIG. 15 is a diagram illustrating a configuration of the other reel holder in the reel holding device according to the embodiment of the present disclosure.

Next, another embodiment of the reel holding device (carriage 5) having tape guiding unit 60b will be described with reference to FIG. 15. The another embodiment is different from the embodiment of FIG. 13 in that reel guide 61 is not provided with pivotal stopper 63. That is, a stop position when reel pressing member 60 rotates is not regulated. In FIG. 15, when carrier tape 7 pulled out from reel 8 is drawn into tape feeder 6 (arrow b), force Fc is applied to reel 8 held by reel holder 9 in a direction in which carrier tape 7 is pulled out.

Force Fd for rotating tape guiding unit 60b toward reel 8 is applied to reel pressing member 60, tape guiding unit 60b rotates so that reel contact surface 60d comes into contact with the outer periphery of reel 8, and force Fe for pushing reel 8 back to reel holder 9 is generated. Accordingly, reel 8 can be prevented from being separated. Further, as tape guiding unit 60b stops the movement of reel 8, terminal end portion 7t of carrier tape 7 can be surely pulled out from reel core 8a.

The tape feeder according to the present disclosure can optimize an operation of replenishing the following tape to the tape feeder, and is useful in a field in which a component is mounted on a board.

What is claimed is:

1. A tape feeder that is used in a component mounting device for installing a component on a board, the component being held by a mounting head, transports a carrier tape containing the component, and supplies the component to a component extraction position by the mounting head, the tape feeder comprising:
  a tape guideway that has an insertion port into which a leading tape and a following tape can be inserted, the following tape being a carrier tape fed after the leading tape;
  a first tape transporter that is provided on a downstream side of the tape guideway, and transports the leading tape to the component extraction position in the tape guideway;
  a second tape transporter that is provided on an upstream side of the tape guideway, and transports the following tape from the insertion port to the first tape transporter;
  a following tape holder that has a first supporter that supports one side of an uninserted portion of the following tape not inserted into the insertion port in a width direction from a lower side, and a second supporter that supports the other side of the uninserted portion in a width direction from the lower side, and holds the uninserted portion of the following tape at a position separated upward from an uninserted portion of the leading tape; and
  a displacer that displaces a position of the second supporter upward with respect to the first supporter, and displaces the uninserted portion of the following tape from the following tape holder,
  wherein a width of one end portion of the second supporter decreases toward the insertion port.

2. The tape feeder of claim 1,
  wherein the following tape holder has a guide surface that guides one side surface of the following tape in the width direction, and a plate-shaped member in which the first supporter is formed, and
  wherein the displacer has a guide surface that guides the other side surface of the following tape in the width direction, and a movable member that has the second supporter formed therein and is vertically displaceable with respect to the plate-shaped member.

3. The tape feeder of claim 2,
  wherein the movable member is swingable about a horizontal shaft, and
  wherein the displacer has a spring for urging the movable member downward, and a stopper that positions the second supporter at the same height as a height of the first supporter by regulating downward displacement of the movable member.

4. The tape feeder of claim 2,
  wherein the plate-shaped member has a protrusion that is formed at a position separated upward from the first supporter.

5. The tape feeder of claim 4,
  wherein a width of a lower end portion of the protrusion in a horizontal direction decreases as the protrusion goes downward.

6. The tape feeder of claim 2,
  wherein the movable member has a one-way clutch, and a sprocket mounted on a shaft through the one-way clutch, and
  wherein the one-way clutch permits rotation of the sprocket when the following tape moves on the following tape holder in a direction toward the insertion port, but does not permit rotation of the sprocket when the following tape moves on the following tape holder in an opposite direction to the direction toward the insertion port.

* * * * *